US011040366B2

United States Patent
Simpson et al.

(10) Patent No.: US 11,040,366 B2
(45) Date of Patent: Jun. 22, 2021

(54) DISPENSER SHIELD WITH ADJUSTABLE APERTURE TO IMPROVE DROP PLACEMENT AND RESIDUAL LAYER THICKNESS

(71) Applicant: CANON KABUSHIKI KAISHA, Tokyo (JP)

(72) Inventors: Logan L. Simpson, Coupland, TX (US); Seth J. Bamesberger, Austin, TX (US); John Williamson, Thorndale, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 165 days.

(21) Appl. No.: 16/134,827

(22) Filed: Sep. 18, 2018

(65) Prior Publication Data

US 2020/0086339 A1    Mar. 19, 2020

(51) Int. Cl.
| | | |
|---|---|---|
| B05B 12/32 | (2018.01) | |
| B05B 12/34 | (2018.01) | |
| B05B 12/22 | (2018.01) | |
| B05C 11/10 | (2006.01) | |
| B05C 5/02 | (2006.01) | |
| G03F 7/00 | (2006.01) | |
| B05B 1/14 | (2006.01) | |
| B05B 12/16 | (2018.01) | |

(52) U.S. Cl.
CPC ............ B05B 12/32 (2018.02); B05B 1/14 (2013.01); B05B 12/16 (2018.02); B05B 12/22 (2018.02); B05B 12/34 (2018.02); B05C 5/0212 (2013.01); B05C 5/0266 (2013.01); B05C 11/1039 (2013.01); G03F 7/0002 (2013.01); B05C 5/025 (2013.01)

(58) Field of Classification Search
CPC ......... B05B 12/16; B05B 12/22; B05B 12/32; B05B 12/34; B05C 5/0262; B05C 5/0266
See application file for complete search history.

(56) References Cited

U.S. PATENT DOCUMENTS

| | | | |
|---|---|---|---|
| 4,014,029 A | 3/1977 | Lane et al. | |
| 5,490,879 A * | 2/1996 | Corradi | B05C 5/0266 118/212 |
| 5,622,110 A * | 4/1997 | Orzechowski | B41F 7/30 101/148 |
| 5,679,387 A * | 10/1997 | Cloeren | B29C 48/313 425/381 |
| 6,423,144 B1 * | 7/2002 | Watanabe | B05C 5/0266 118/410 |
| 6,565,660 B1 * | 5/2003 | Wagner | B05C 5/0266 118/673 |

(Continued)

Primary Examiner — Binu Thomas
(74) Attorney, Agent, or Firm — Canon U.S.A., Inc., IP Division

(57) ABSTRACT

A fluid dispenser apparatus includes a fluid dispenser having plurality of nozzles aligned in a first longitudinal direction. A dispenser shield is positioned relative to the plurality of nozzles, the dispenser shield configured to form an aperture aligned in the first longitudinal direction with the plurality of nozzles. The plurality of nozzles are configured to dispense fluid towards a substrate. The dispenser shield is further positioned such that fluid dispensed from a first subset of the plurality of nozzles passes through the aperture while fluid dispensed from a second subset of the plurality nozzles is captured by the dispenser shield.

17 Claims, 8 Drawing Sheets

(56) References Cited

U.S. PATENT DOCUMENTS

| | | | |
|---|---|---|---|
| 9,713,924 B2 | 7/2017 | Morooka et al. | |
| 2001/0036512 A1* | 11/2001 | Ito | B05C 5/025 118/664 |
| 2010/0102471 A1* | 4/2010 | Truskett | B82Y 10/00 264/40.7 |
| 2018/0333733 A1* | 11/2018 | Fritz | B05B 12/22 |

* cited by examiner

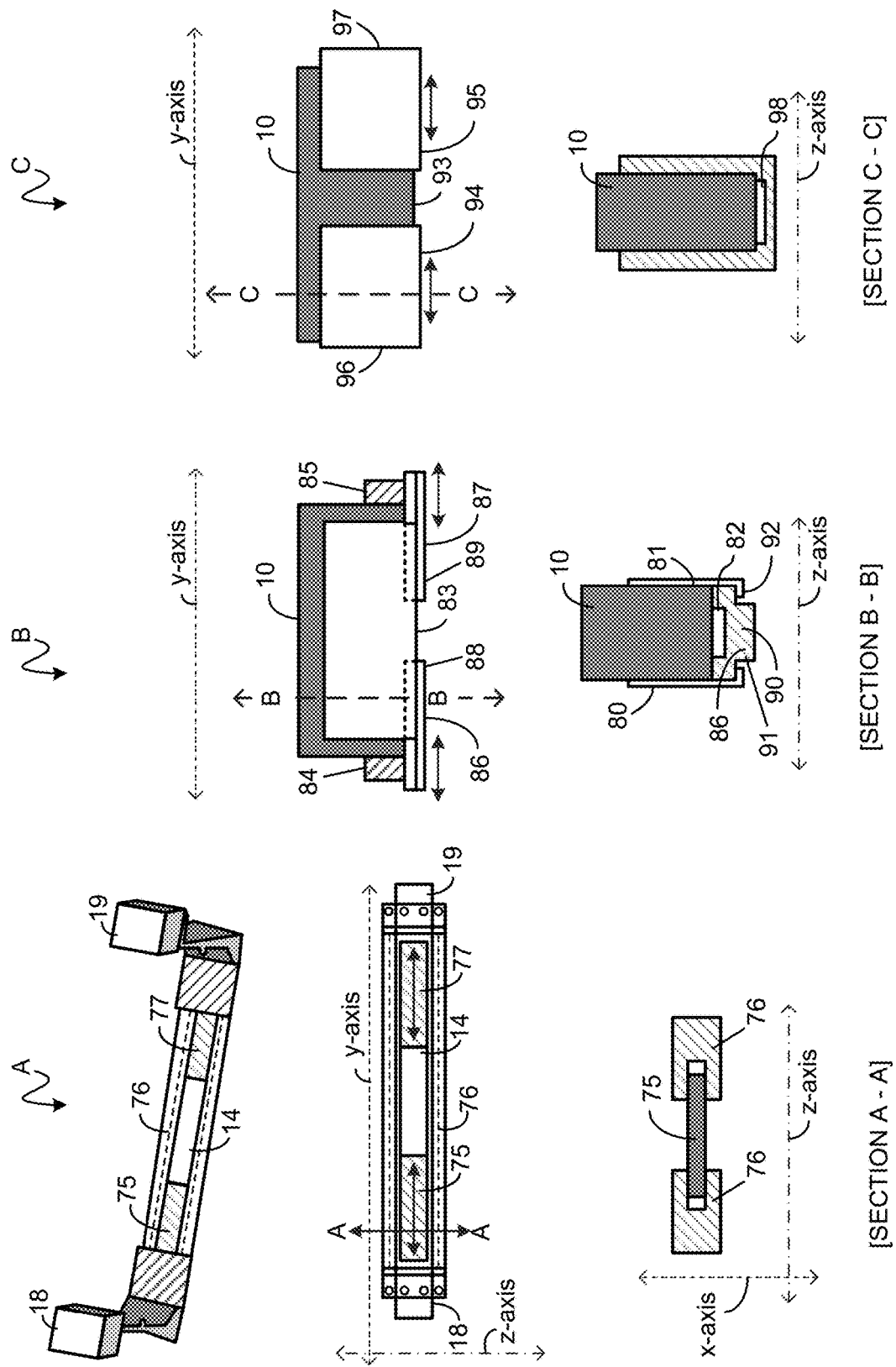

TIMING TABLE

| FIG. | Time | Imprint Process | Dispenser (ON/OFF) | Aperture Vac (ON/OFF) |
|---|---|---|---|---|
| FIG. 4A | 1 | Dispense on substrate | ON | OFF |
| FIG. 4B | 2 | Move dispensed field to imprint location | OFF | ON |
| FIG. 4C | 3 | Imprint and separate (not shown) | OFF | ON |
| FIG. 4D | 4 | Move substrate to dispenser and stop substrate stage motion | OFF | ON |

*FIG. 7*

DISPENSER SHIELD WITH ADJUSTABLE APERTURE TO IMPROVE DROP PLACEMENT AND RESIDUAL LAYER THICKNESS

FIELD OF THE DISCLOSURE

The subject disclosure relates to fluid dispensers and fluid dispenser apparatuses. And in more particularity, the subject disclosure relates to the improvement of fluid dispenser drop pattern performance utilizing shielding techniques.

BACKGROUND INFORMATION

Nanoimprint lithography (NIL) is a method of fabricating nanometer scale patterns. It is a simple nanolithography process with low cost, high throughput and high resolution. It creates patterns by mechanical deformation of imprint resist and subsequent processes. The imprint resist is typically a monomer or polymer formulation that is cured by heat or UV light during the imprinting. Adhesion between the resist and the template is controlled to allow proper release.

A key benefit of nanoimprint lithography is its sheer simplicity. The single greatest cost associated with chip fabrication is the optical lithography tool used to print the circuit patterns. Optical lithography requires high powered excimer lasers and immense stacks of precision ground lens elements to achieve nanometer scale resolution. There is no need for complex optics or high-energy radiation sources with a nanoimprint tool. There is no need for finely tailored photoresists designed for both resolution and sensitivity at a given wavelength. The simplified requirements of the technology lead to its low cost. Silicon master molds can be used up to a few thousands imprints while nickel molds can last for up to a ten of thousand cycles.

Nanoimprint lithography manufacturing equipment utilizes a patterning technology that involves the field-by-field deposition and exposure of a low viscosity resist deposited by jetting technology onto the substrate, reliably reproducing patterns with a higher resolution and greater uniformity compared to those produced by photolithography equipment. This technology simplifies the cutting-edge lithography processes used to manufacture semiconductor devices, to make possible a significantly reduced cost of ownership.

With nanoimprint lithography, a patterned mask is lowered into the fluid which then quickly flows into the relief patterns in the mask by capillary action. Following this filling step, the resist is crosslinked under UV radiation, and then the mask is removed, leaving a patterned resist on the substrate. The technology reliably reproduces patterns with a higher resolution and greater uniformity compared to those produced by photolithography equipment. Additionally, as this technology does not require an array of wide-diameter lenses and the expensive light sources necessary for advanced photolithography equipment, NIL equipment achieves a simpler, more compact design, allowing for multiple units to be clustered together for increased productivity.

A key characteristic of nanoimprint lithography (except for electrochemical nanoimprinting) is the residual layer thickness (RLT) following the imprint process (a.k.a. "residual layer thickness"). It is preferable to have thick enough residual layers to support alignment and throughput and low defects. However, this renders the nanoimprint lithography step less critical for critical dimension (CD) control than the etch step used to remove the residual layer. Hence, it is important to consider the residual layer removal an integrated part of the overall nanoimprint patterning process. In a sense, the residual layer etch is similar to the develop process in conventional lithography.

FIG. 8 of the subject disclosure is a general schematic of an example dispenser of existing dispensing systems which produce and are subjected to "bowing effects" and "RLT banding effects" as depicted on a substrate field area. The dispenser is arranged to dispense drops along a dispenser "y-axis". Currently, drops dispensed beyond a "top edge" and a "bottom edge" of the drop pattern can have significant drop placement and drop size variation versus the drops dispensed in the center from the dispenser. This is because the "top edge" and the "bottom edge" drops (hereinafter "edge" drops) often have a higher drop velocity. In turn, this results in the edge drops hitting the substrate field area sooner than drops in the center of the pattern which produces so-called "bowing" of the drop pattern. Similarly, the individual drop volume of the edge drops can be of a different volume than the center drops, thus, adversely impacting the RLT uniformity (or "RLT banding").

Historically, significant resources have been spent to minimize the aforementioned edge drop effects. Compounding this problem, the degree of this effect is a function of exact pattern to be dispensed. Some are worse than others. Unfortunately, the design of the dispensers, the resist material and energetics of the dispensing are inextricably linked. If this issue could be eliminated altogether, dispenser setup would be much easier and faster.

Currently, some structures and shielding techniques have been implemented in dispensing and printing apparatuses for various purposes, but there are no teachings which appear to provide an adequate solutions for eliminating unwanted "bowing effects" and "RLT banding effects". In support of the above statement/observations, several references pertaining to shielding techniques implemented in dispensing and printing apparatuses will now herein be discussed below.

U.S. Pat. No. 4,014,029, entitled "Staggered Nozzle Array" to Lane et al. (hereinafter "LANE") utilizes a shield used in conjunction with a dispenser utilized in the printing field. In LANE, a jet printer includes a nozzle plate having at least two rows of nozzles, with the nozzles in one row being laterally staggered with respect to the nozzles in another row. The jets emanating from the respective rows of nozzles are directed in non-parallel trajectories to form at least a portion of a single line of dots at a time on a printing medium, with the jets from a given row forming non-adjacent dots on the printing medium. In practice, the nozzle plate is comprised of a semiconductor substrate, for example silicon, with the exit aperture of each of the nozzles in at least one row being axially misaligned with respect to the longitudinal center axis of their respective entrance apertures, resulting in a non-normal jet trajectory with respect to the plane of the nozzle plate. (See LANE Abstract).

While LANE discloses a ceramic structure with a plurality of slots coated with a conductive coating for directing charged droplets. LANE is directed towards "direct charged drops" which utilizes a conductive coating. Thus, LANE does not address a nanoimprint process which does not utilized direct change drops, and of which utilizes a single slot, physical barrier without a conductive coating.

U.S. Patent Publication 2010/0102471 A1, entitled "Fluid transport and Dispensing" to Truskett et al. (hereinafter "TRUSKETT") discloses fluid transport and dispensing methods utilized imprint lithography systems. In particular, TRUSKETT teaches imprint lithography systems and methods for transporting and dispensing polymerizable material on a substrate. In one implementation, the transport system utilizes a dispense head, dispense guard, and a shielding block when dispensing the polymerizable material. In another implementation, the transport system comprises one or more filters positioned in an inline manifold for particle reduction or ion reduction. (See TRUSKETT Abstract).

While TRUSKETT teaches a guard plate purposed to reduce airflow and block UV energy, the TRUSKETT guard plate does not act as a physical barrier to drops that have poor trajectory/size thereby improving overall drop placement. Moreover, TRUSKETT does not address a desired need to include features for precise adjustment of width and placement along the dispenser.

U.S. Pat. No. 9,713,924 B2, entitled "Liquid Jet Head Having Drive Electrodes of Different Depths on Ejection and Dummy Channels" to Morooka (hereinafter "MOROOKA") discloses a liquid jet head which includes ejection channels and dummy channels alternately arrayed across partitions to configure a channel row. Drive electrodes are provided that are side surfaces of the partitions and are positioned from upper ends of the partitions in a depth direction, and an average depth of two drive electrodes positioned on facing side surfaces of the ejection channel is different from an average depth of two drive electrodes positioned on facing side surfaces of the dummy channel adjacent to the ejection channel. (See MOROOKA Abstract).

While MOROOKA teaches a cover plate bonded to an actuator PZT substrate, the MOROOKA cover plate does not address any of the needed solutions for eliminating unwanted "bowing effects" and "RLT banding effects" in a dispensing process.

Thus, a known disadvantage common to LANE, TRUSKETT and MOROOKA and other proposed solutions is that none of these references teach direct solutions pertaining to eliminating unwanted "bowing effects" and "RLT banding effects" which are known to be inherent in conventional nanoimprint (NIL) dispenser apparatuses and affiliated utilized processes.

Since there is still a known disadvantage common to the above references and other proposed solutions regarding eliminating unwanted "bowing effects" and "RLT banding effects", a need continues to exist for improvement pertaining to such aspects of dispensing and drop pattern effectiveness. In view of these considerations, it would be advantageous to address and/or overcome at least some of the deficiencies described herein above.

SUMMARY OF THE DISCLOSURE

A simpler, more-effective and less costly solution is being disclosed to eliminate the edge drops from the dispensed pattern of drops that is necessary for imprinting. In particular, implementation of a structure and/or shield is being proposed by the Applicant of the subject disclosure to prevent minimize unwanted edge drop effects.

According to various example embodiments of the present disclosure, a dispenser shield with an adjustable aperture to improve drop placement and residual layer thickness (RLT) and uniformity control is disclosed that addresses and/or overcomes at least some of the deficiencies indicated herein above (i.e., elimination of unwanted "bowing effects" and "RLT banding effects").

To accomplish such desired improvements, the pattern height is increased (i.e. in Y-direction) such that the problematic drops (those with higher velocity and size) are extended beyond the desired field height dimension. A dispenser shield is utilized to intercept the problematic drops before they hit the field area of the substrate or wafer. The dispenser shield has an aperture that allows the desired drops (the ones with more uniform velocity and size) to impact the field are of the substrate/wafer as usual.

According to an embodiment of the present disclosure, a fluid dispenser apparatus is provided that includes a fluid dispenser including plurality of nozzles aligned in a first longitudinal direction. A dispenser shield is positioned relative to the plurality of nozzles, the dispenser shield configured to form an aperture aligned in the first longitudinal direction with the plurality of nozzles. The plurality of nozzles are configured to dispense fluid towards a substrate. The dispenser shield is further positioned such that fluid dispensed from a first subset of the plurality of nozzles passes through the aperture while fluid dispensed from a second subset of the plurality nozzles is captured by the dispenser shield.

Furthermore, according to another embodiment of the present invention, the aperture is adjustably moveable along the first longitudinal direction. Additionally, the aperture can be expanded or contracted along the first longitudinal direction.

According to yet another embodiment of the present disclosure, the dispenser shield includes a channel for receiving the captured fluid from the dispenser shield.

Additionally, according to yet another embodiment of the present disclosure, the fluid dispenser apparatus further includes at least one vacuum port system which facilitates removal of the captured fluid from the dispenser shield. The at least one vacuum port system includes a vacuum port connected to a tube that has a terminus end position within the channel for removing the captured fluid from the dispenser shield.

According to an embodiment of the present disclosure, the fluid dispenser apparatus further includes a pair of aperture support brackets configured to attach the dispenser shield to the fluid dispenser, wherein the dispenser shield has opposing distal ends along the first longitudinal direction, and wherein one of the pair of aperture support brackets is attached to a respective each one of the opposing distal ends of the dispenser shield.

According to an embodiment of the present disclosure, the fluid dispenser includes a tensioning adjustment feature for adjusting tension of the dispenser shield to prevent the dispenser shield from sagging relative to the fluid dispenser.

Additionally, according to an embodiment of the present disclosure, the second subset of plurality nozzles are located above blocking portions of the dispenser shield.

Still yet furthermore, according to another embodiment of the present disclosure, a fluid dispenser shield assembly is provided which is adapted to be installed onto a fluid dispenser including plurality of nozzles aligned in a first longitudinal direction. Here, the fluid dispenser shield assembly includes a dispenser shield configured to be positioned relative to the plurality of nozzles, the dispenser shield configured to form an aperture aligned in the first longitudinal direction with the plurality of nozzles, wherein the plurality of nozzles are configured to dispense fluid towards a substrate, and wherein the dispenser shield is further positioned such that fluid dispensed from a first subset of the plurality of nozzles passes through the aperture while fluid dispensed from a second subset of the plurality nozzles is captured by the dispenser shield.

Moreover, according to another embodiment of the present disclosure, an imprint apparatus is provided which includes a fluid dispenser including plurality of nozzles aligned in a first longitudinal direction; and a dispenser shield positioned relative to the plurality of nozzles, the dispenser shield configured to form an aperture aligned in the first longitudinal direction with the plurality of nozzles. The plurality of nozzles are configured to dispense fluid towards a substrate, and the dispenser shield is further positioned such that fluid dispensed from a first subset of the plurality of nozzles passes through the aperture while fluid dispensed from a second subset of the plurality nozzles is captured by the dispenser shield.

Additionally, according to still yet another embodiment of the present disclosure, a method of manufacturing an article is provided. The method includes forming a pattern on a substrate using an imprint apparatus; and processing the substrate, on which the pattern has been formed, to manufacture the article, wherein the imprint apparatus performs imprint processing of forming a pattern of an imprint material on the substrate using a mold. Here, the imprint apparatus includes a fluid dispenser including plurality of nozzles aligned in a first longitudinal direction; and a dispenser shield positioned relative to the plurality of nozzles, the dispenser shield configured to form an aperture aligned in the first longitudinal direction with the plurality of nozzles. The plurality of nozzles are configured to dispense fluid towards a substrate. The dispenser shield is further positioned such that fluid dispensed from a first subset of the plurality of nozzles passes through the aperture while fluid dispensed from a second subset of the plurality nozzles is captured by the dispenser shield.

These and other aspects, features, and advantages of numerous example embodiments of the present disclosure will become apparent upon reading the following detailed description of the numerous example embodiments of the present disclosure, when taken in conjunction with the appended drawings, and provided claims.

BRIEF DESCRIPTION OF THE DRAWINGS

Further aspects, features and advantages of the present disclosure will become apparent from the following detailed description when taken in conjunction with the accompanying figures showing the illustrative numerous embodiments of the present disclosure in which:

FIGS. 5A-C illustrate several different embodiments for adjustable aperture features, according to several aspects of the disclosure.

FIG. 7 is an example dispenser operations timing table, according to an aspect of the disclosure.

DETAILED DESCRIPTION OF THE DISCLOSURE

Figure 1:
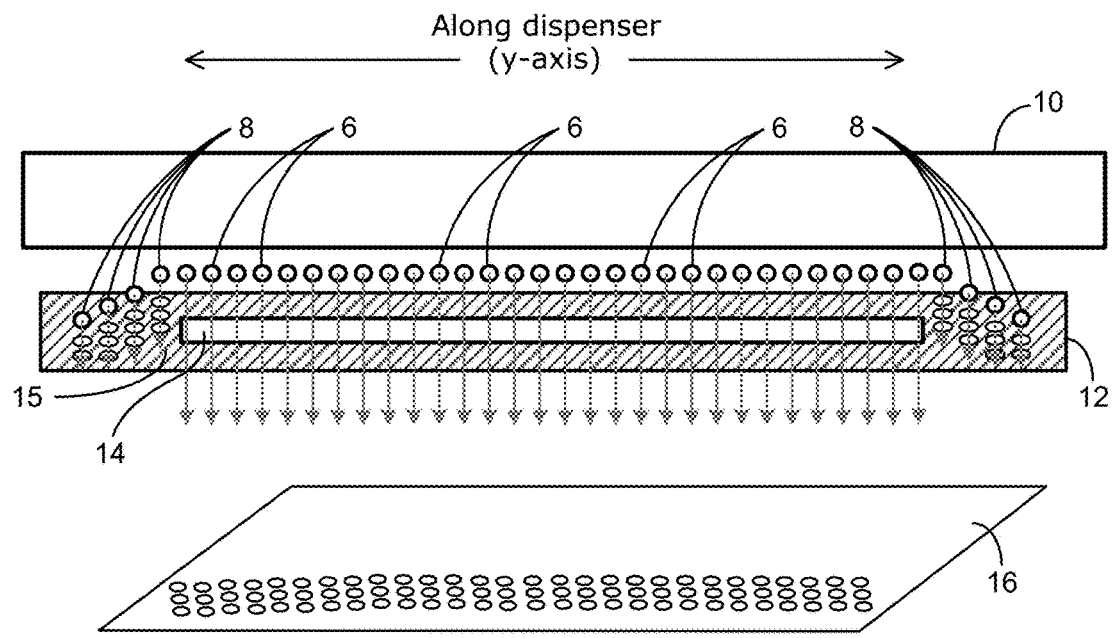
FIG. 1 is a general schematic illustration of an example dispenser shield that improves drop placement and RLT uniformity, according to first example embodiment of the disclosure.

Hereinafter, various modes to implement the disclosure will be described in detail with numerous example embodiments and reference to the drawings/figures. Note that, dimensions, materials, shapes, and relative arrangement of components described in the example embodiments are to be appropriately modified in accordance with a configuration of an apparatus to which the disclosure is applied and various conditions, and the scope of the disclosure is not intended to be limited to the following example embodiments.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative example embodiments. It is intended that changes and modifications can be made to the described example embodiments without departing from the true scope and spirit of the subject disclosure as defined by the appended claims.

Accordingly, the foregoing merely illustrates the principles of the disclosure. Various modifications and alterations to the described exemplary embodiments will be apparent to those skilled in the art in view of the teachings herein.

First Example Embodiment of Example Dispenser Apparatus and Shield Assembly

FIG. 1 is a general schematic illustration of an example dispenser shield 12 with an aperture 14 that improves drop placement and RLT uniformity, according the first example embodiment of the disclosure. The dispenser shield 12 is placed between a dispenser 10 and a substrate/wafer field area 16. The dispenser 10 is arranged to dispense/eject drops 6 along a dispenser "y-axis". Drops 8 are blocked by dispenser shield 12 blocking portions 15 formed on both sides of the aperture 14. Here, since the drops 8 have been blocked, "bowing" of the drop pattern can be reduced and the overall drop placement and RLT uniformity can be improved by removing "edge of pattern" drops 8 from the dispensed pattern.

Figure 2:
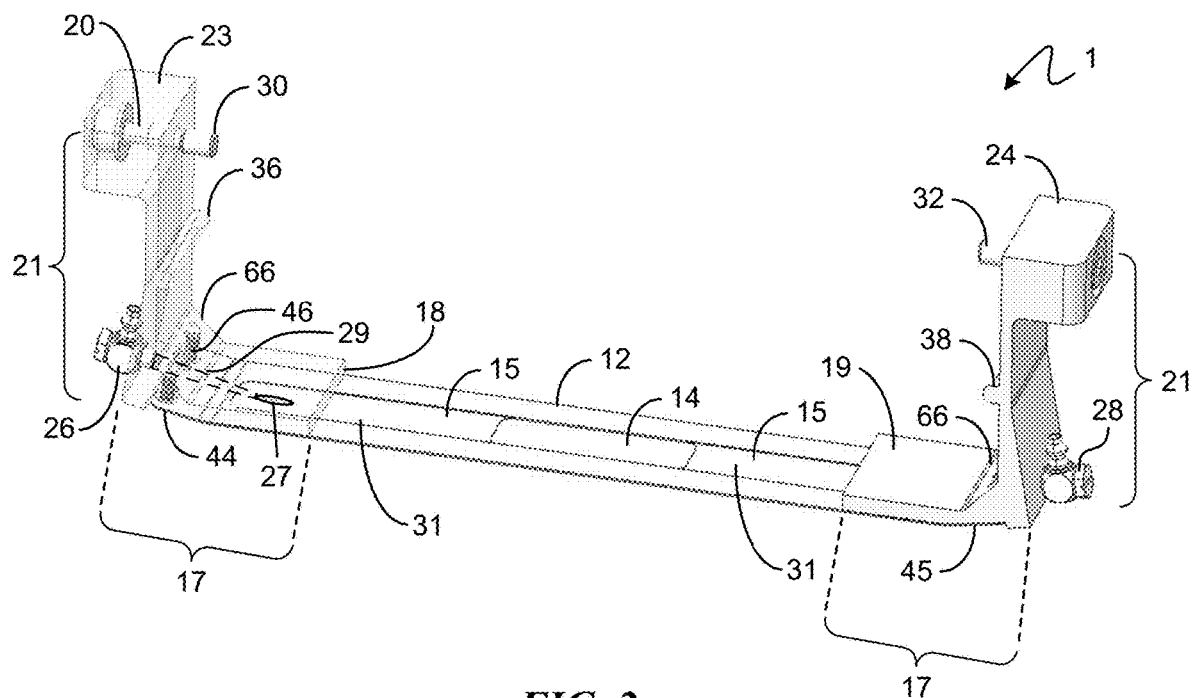
FIG. 2 is a perspective view illustration of an example dispenser shield with aperture support brackets (also referred to as a "dispenser shield assembly"), according to the first example embodiment of the disclosure.

FIG. 2 is a perspective view of an example dispenser shield 12 with example aperture supporting brackets 18, 19 (hereinafter also referred to as "dispenser shield assembly 1), according to the first example embodiment of the disclosure. Each aperture supporting bracket 18, 19 has a generally horizontally oriented portion 17 which is adapted to be integrated with and/or attached to each distal end of the dispenser shield 12. Furthermore, each aperture supporting bracket 18, 19 has a generally vertically oriented portion 21 (also referred to as "vertical portions") formed integral to and configured generally perpendicularly normal to the horizontally oriented portions 17 of the supporting brackets 18, 19. Mounting portions 23, 24 are formed and/or provided on distal ends of the vertical portions 21 which are utilized to attach the aperture supporting brackets 18, 19 to a dispensing apparatus dispenser unit mounting carriage 49 (see FIG. 3A). Additionally, each of the mounting portions 23, 24 is provided with a receiving bolt hole 20, 22 which is configured to receive a mounting bolt 30, 32, respectively. Furthermore, a pair of mounting tabs 44, 45 are each, respectively, formed on opposing distal ends of the dispenser shield 12 for mounting the dispenser shield 12 to each respective supporting bracket 18, 19. Also, a pair of bolts/fasteners 46 are utilized to secure mounting tabs 44, 45 to each distal end of the dispenser shield 12.

Still referring to FIG. 2, it is noted that the dispenser shield 12 includes a channel 31 formed integrally within the dispenser shield 12 which is provided to catch the edge drops 8 which have been blocked by blocking portions 15 formed on both sides of the aperture 14 of the dispenser shield 12. A vacuum port feature/system includes pair of vacuum ports 26, 28 which are provided on lower external ends of the vertical portions 21 and a vacuum passageway 29 (or bore; and also sometimes referred to as vacuum tube 29) formed through the horizontally oriented portions 17 of the supporting brackets 18, 19, which connects the vacuum ports 26, 28 directly to the channel 31, via a vacuum tube aperture 27, so that the edge drops 8 which have been blocked and of which pool/or collect in the channel 31 may be removed/evacuated by a vacuum pulled through the pair of vacuum ports 26, 28.

Figure 3A:
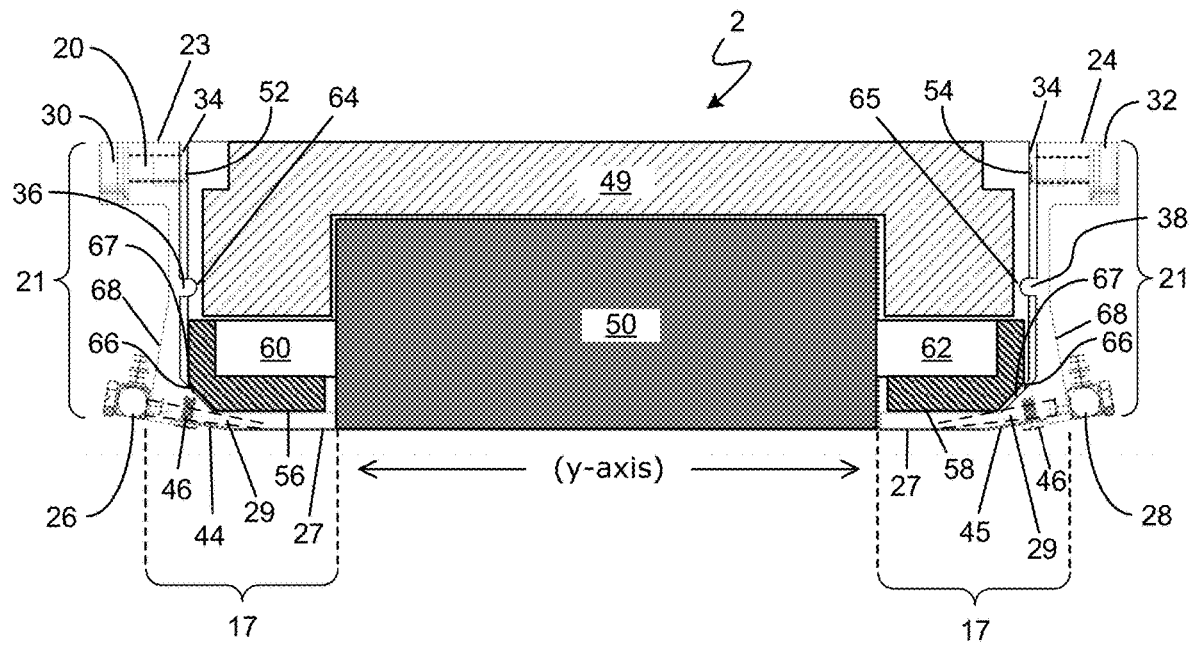
FIGS. 3A-B include a side view and bottom view, respectively, of the example dispenser shield assembly, installed into an example dispensing apparatus, according to the first example embodiment of the disclosure.
Figure 3B:
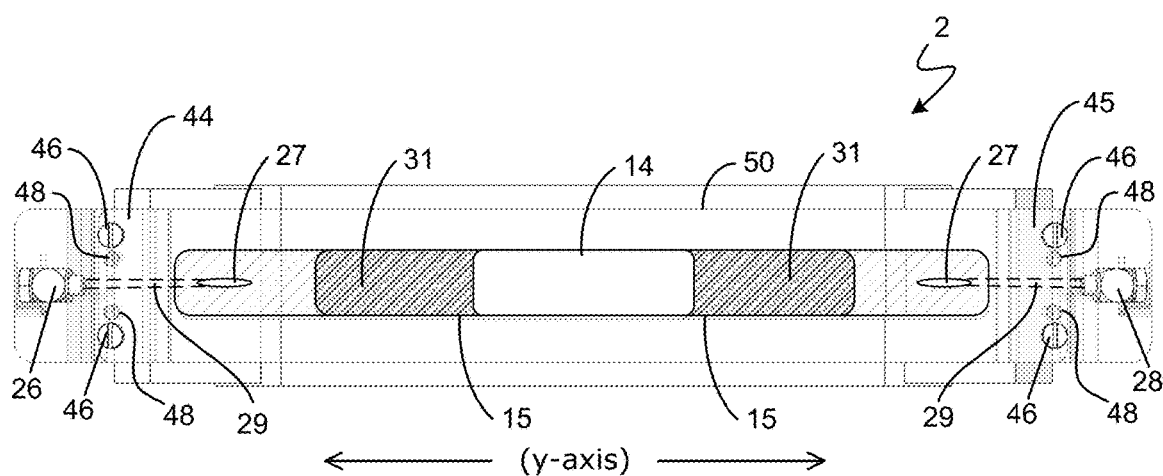

FIG. 3A is a side view and FIG. 3B is a bottom view of the example dispenser shield assembly 1 (dispenser shield 12 with supporting brackets 18, 19) installed into an example dispensing apparatus/system 2, according to the first example embodiment of the disclosure. Here, an example dispensing unit 50 is installed into a dispenser unit mounting carriage 49. Dispenser unit mounting tabs 60, 62 are secured to the mounting carriage 49 by L-shaped receiving arms 56, 58. It is further noted that the L-shaped receiving arms 56, 58 each have an outer beveled edge 67 which mates/engages and/or fits into an inner beveled corner 66 formed on each aperture support bracket 18, 19 (see also FIGS. 4A-B discussion below for further details).

Now referring specifically to the side view of the example dispensing system 2 in FIG. 3A, it is noted that the dispenser unit mounting carriage 49 includes a pair of receiving mounts 52, 54 adapted to receive a mounting bolts 30, 32 respectively. Moreover, as depicted in FIG. 3A, pivot features 36, 38, 64, 65 are utilized for positioning the brackets 18, 19 into the mounting carriage 49.

Still referring to FIG. 3A, it is also noted that the supporting brackets 18, 19 of the dispenser shield assembly 1 (dispenser shield 12 and the supporting brackets 18, 19) each includes several tensioning features (or also referred to as components of a cumulative tensioning system) to prevent the dispenser shield 12 and aperture support brackets 18, 19 from sagging when installed into a dispensing apparatus/system 2 and for keeping the aperture 14 in tension along the y-axis.

One aspect of the tensioning features of the subject disclosure includes the pivot features 36, 38, 64, 65 which are utilized for keeping the aperture 14 in tension along the y-axis by adjusting a gap 34 between bracket mounting portions 23, 24 and mounting portions 52, 54 of the mounting carriage 49. For example, the pivot feature for the shown example embodiment may include longitudinal protrusions 36, 38 formed generally about in the middle of the vertical portions 21 of the supporting brackets 18, 19 which are configured to be received by protrusion receiving longitudinal indentions 64, 65 formed on each side of the mounting carriage 49. Another aspect of the tensioning features of the subject disclosure includes the mounting portions 23, 24, the receiving bolt holes 20, 22, and the mounting bolts 30, 32, respectively, which are further utilized to adjust the location of the shield aperture 12 about the "y-axis" by tightening or loosening bolts 30, 32 (see FIG. 1). While yet another tensioning feature of the disclosure further includes the pair of bolts/fasteners 46 (and affiliated receiving bores in the horizontally oriented portions 17 of the supporting brackets 18, 19) and the mounting tabs 44, 45 for each distal end of the dispenser shield 12. That is to say, even though the bolts 46 are primarily used for mounting the dispenser shield to the supporting brackets, tension across the y-axis of the dispenser shield 12 may be also be slightly adjusted by moving the dispenser shield 12 an amount provided by the clearance between the bolt 46 and the receiving bore on the shield prior to tightening the bolt 46. Hence, the cumulative effects of the aforementioned tensioning features provide the dispensing apparatus/system 2 several options for maintaining the aperture 14 in tension along the y-axis.

Next, referring specifically to the bottom view of the example dispensing apparatus/system 2 in FIG. 3B, the pair of bolts 46 utilized to secure the mounting tabs 44, 45 for each distal end of the dispenser shield 12 are now more easily visible. It is further noted that each of the generally horizontally oriented portions 17 of the supporting brackets 18, 19 also include a pair of positioning holes 48, in between each pair of bolts 46. Additionally, FIG. 3B depicts an example position of the vacuum tube apertures 27 (formed from the vacuum passageway/bore 29) that are part of the previously discussed vacuum system features.

Figure 4A:
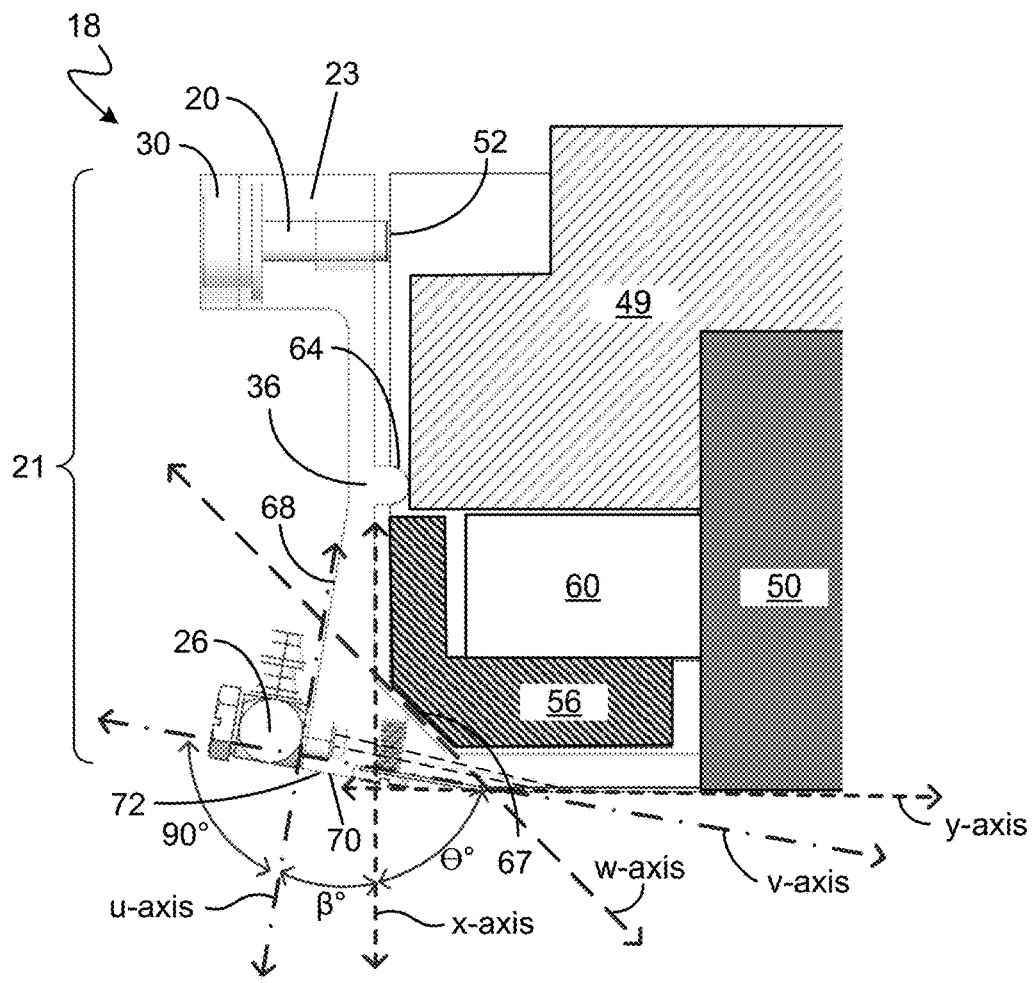
FIGS. 4A-B include a detailed side view and detailed perspective view, respectively, of an example aperture support bracket, according to the first example embodiment of the disclosure.
Figure 4B:
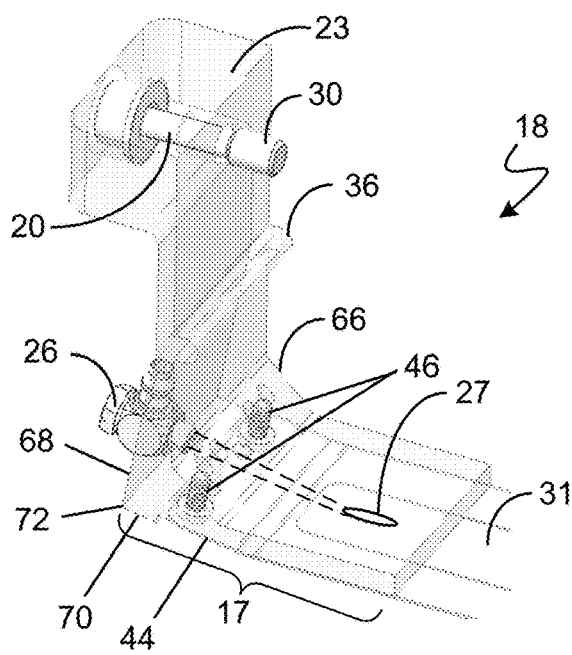
Figure 6A:
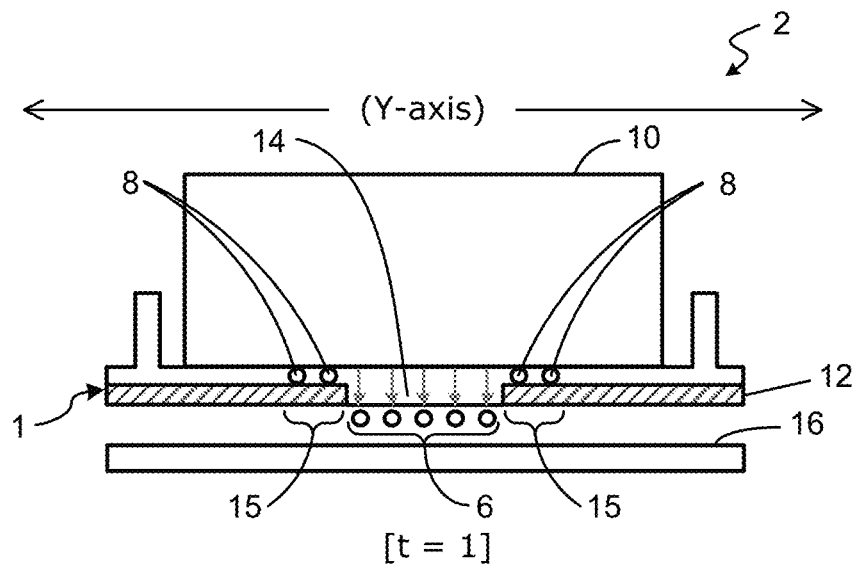
FIGS. 6A-D is an example dispenser operations timing diagram, according to an aspect of the disclosure.
Figure 6B:
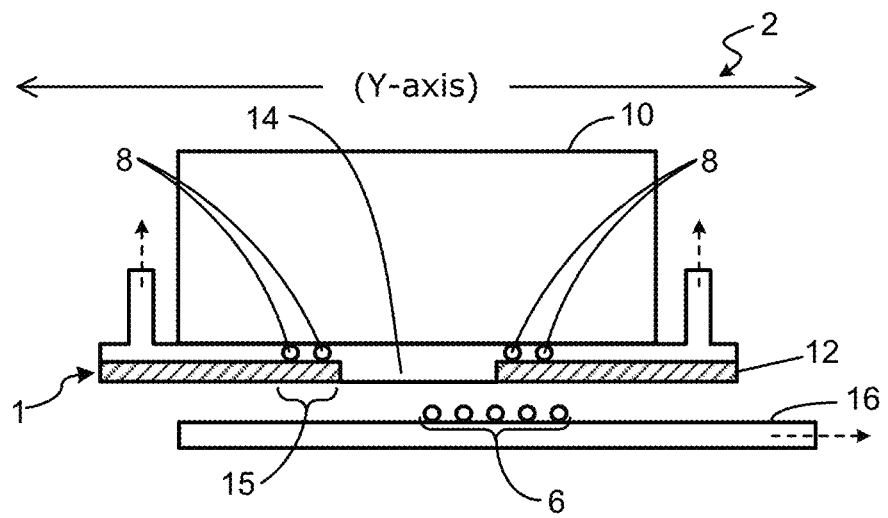
Figure 6C:
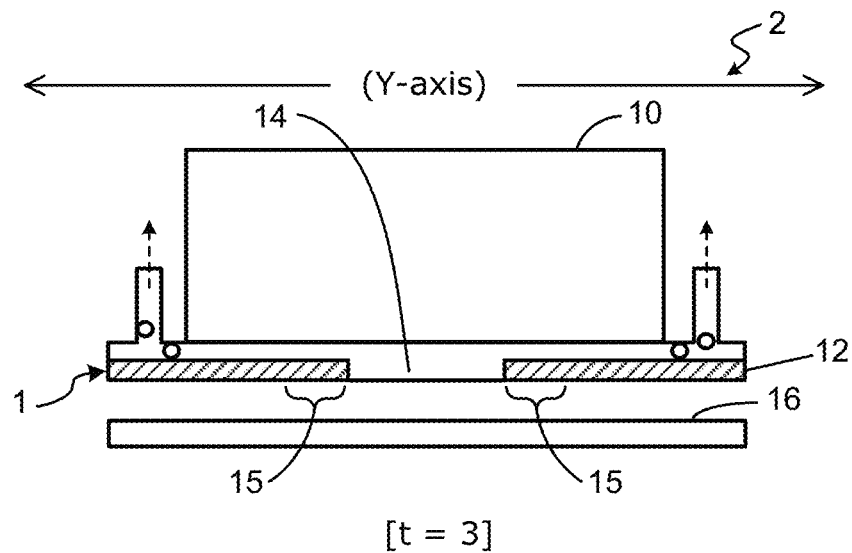
Figure 6D:
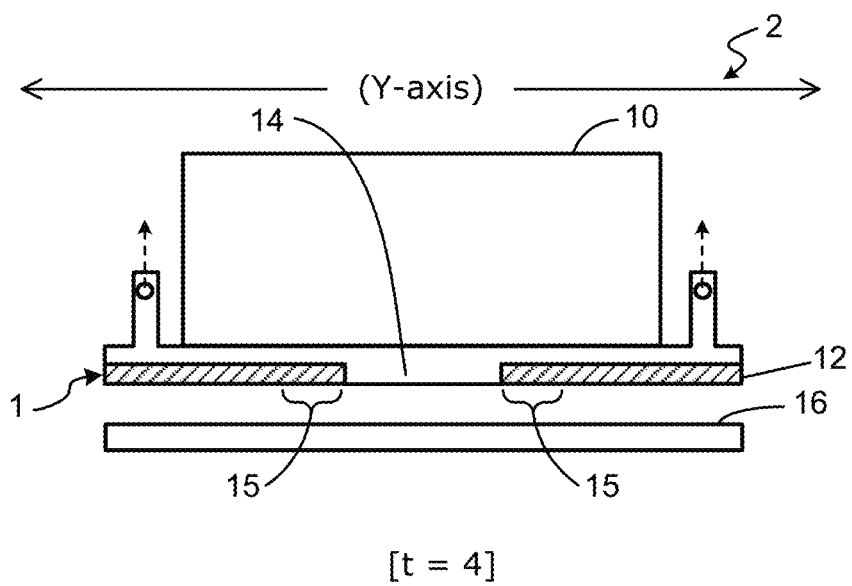
Figure 8:
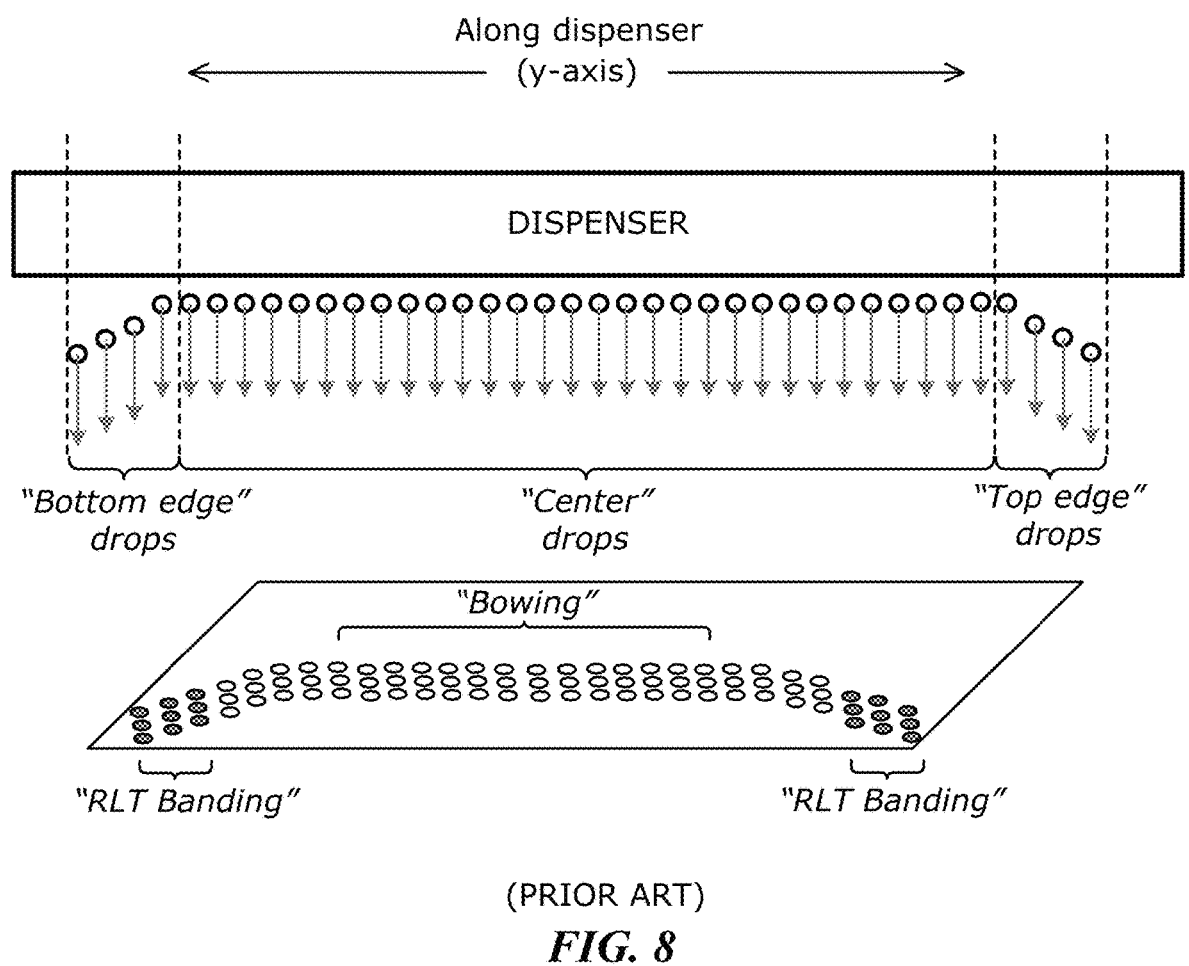
FIG. 8 is a schematic illustration of an example dispenser utilized in existing dispensing systems which produce and are subjected to unwanted bowing effects and RLT banding effects.

FIGS. 4A-B include a detailed side view and detailed perspective view, respectively, of one of the aperture support brackets 18, for example, according to the first example embodiment of the disclosure.

Now specifically referring to FIG. 4A, further detail of an example structural arrangement is illustrated which provides additional structural support 68, 70 to supporting brackets 18, 19 to facilitate secure mounting/installation of the vacuum system features 26, 27, 28, 29 and the pair of bolts/fasteners 46 utilized to secure mounting tabs 44, 45 to each distal end of the dispenser shield 12. Here, it is noticed that an inclined portion 68, which is defined by the "u-axis", is formed integral to, beginning on/or about the lower half of the vertical portion 21 of each of the supporting brackets 18, 19. As is illustrated in FIG. 4A, the amount of β degrees the inclined portion 68 is angled (or flared) outward, is defined between the "x-axis" and the "u-axis", wherein which the "u-axis" defines the orientation of the generally vertical portion 21 of supporting brackets 18, 19. Furthermore, an upwardly inclined portion 70 is provided, which is located at the most outboard distal portion of each of the generally horizontally oriented portions 17 of each aperture supporting bracket 18, 19. Here, it is noticed that the orientation upwardly inclined portion 70, which is defined by the "v-axis", and the inclined portion 68, which is defined by the "u-axis", intersect to form an elbow portion 72 for each supporting bracket 18, 19. Accordingly, the intersection of the upwardly inclined portion 70 and the inclined portion 68, result in the elbow portion 72 having an approximate 90 degree elbow shape for each supporting bracket 18, 19.

Continuing referring to FIG. 4A, further detail of the example structural arrangement is illustrated which provides additional structural support to supporting brackets 18, 19 to facilitate secure mounting/installation of the vacuum system features 26, 27, 28, 29 and the pair of bolts/fasteners 46 utilized to secure mounting tabs 44, 45 to each distal end of the dispenser shield 12. Here, it is noticed that the inner beveled corner 66 of each bracket 18, 19 is oriented parallel to the outer beveled edges 67 of the L-shaped receiving arms 56, 58 of the mounting carriage 49. It can be noticed that the parallel orientation of the inner beveled corners 66 and the outer beveled edges 67 of the L-shaped receiving arms 56, 58 is defined by the "w-axis". Since the inner beveled corners 66 are formed integral to each of the vertical portions 21 and horizontal portions 17, extra structural support is provided on the inside of the elbow portion 72 having the approximate 90 degree elbow shape for each supporting bracket 18, 19. Furthermore, as is illustrated in FIG. 4A, the amount of 0 degrees in which the parallel orientation of the inner beveled corners 66 and the outer beveled edges 67 of the L-shaped receiving arms 56, 58 is defined between the "x-axis" and the "w-axis", wherein which the "x-axis" defines the orientation of the generally vertical portion 21 of supporting brackets 18, 19.

Still referring to FIGS. 4A-B, another purpose of the 90 degree elbow shape for each supporting bracket 18, 19 is to enable mounting of the distal ends of the dispenser shield 12 to the supporting brackets 18, 19 without extending below the bottom aperture surface (surface near the substrate 16). The gap between the dispenser 10 and the substrate 16 is approximately <500 microns. If the bolts 46 extended below the bottom surface, they would interfere with the substrate 16. However, due to the partially upwardly inclined configuration of horizontal portions 17 of the bracket 18, 19, the pair of bolts/fasteners 46 in combination with the similarly upwardly inclined configuration of the mounting tabs 44, 45 of the dispenser shield 12, provides sufficient clearance while further allowing another manner of tension adjustment in the aperture 14. And as mentioned early, the adjustable pivot features 36, 38, 64, 65 and the top bolts 30 and 32 are also considered to be components of the overall tensioning system of the disclosure.

Example Adjustable Aperture Feature Embodiments

FIGS. 5A-C illustrate several different embodiments for additional adjustable aperture features which may be integrated within the dispenser shield assembly 1 (dispenser shield 12 with supporting brackets 18, 19) and/or in combination with the dispenser apparatus/system 2, according to several aspects of the disclosure.

Referring now to FIG. 5A, an embodiment A for adjustable aperture features is provided which utilizes a three-piece adjustable shield assembly 75, 76, 77 instead of the dispenser shield 12 (see FIG. 2). In embodiment A, shield blocking portions 75 and 77 are each individually adjustable along the y-axis. Once the aperture 14 is adjusted to a desired size, the shield blocking portions 75 and 77 may be locked into place by a locking mechanism (not shown in drawing). Accordingly, in embodiment A, the aperture 14 may be expanded or contracted as required either manually or by a motor or the like (not shown in drawing).

Referring now to FIG. 5B, an embodiment B for adjustable aperture features is provided which utilizes a pair of opposing dispenser L-shaped side wall holders 80, 81 which are adapted to receive dispenser 10. End holders 84, 85 are adapted to receive rails 86, 87, respectively, such that the smaller-side 92 of the L-shaped side wall holders 80, 81 engages a recessed portion 91 formed on each side of the rails 86, 87 along the y-axis. Furthermore, a channel 82 is formed in each rail 86, 87 along the y-axis for removing fluid/drops. As can be seen in FIG. 5B, portions 88, 89 of rails 86, 87 are able to block bottom edge and top edge drops and center drops are able to be dispensed through aperture 83 towards the substrate surface.

Referring now to FIG. 5C, an embodiment C for adjustable aperture features provided which utilizes a pair of opposing dispenser U-shaped holders 96, 97 which are adapted to receive dispenser 10. Furthermore, a channel 98 is formed internally in the bottom portion of each U-shaped holder 96, 97 along the y-axis for removing fluid/drops. As can be seen in FIG. 5C, portions 94, 95 of holders 96, 97 are able to block bottom edge and top edge drops and center drops are able to be dispensed through aperture 93 towards the substrate surface.

Example Operations Timing Chart and Table

FIGS. 6A-D is an example dispenser operations timing chart; while FIG. 7 is an affiliated operations timing table, according to an aspect of the disclosure. In particular, FIGS. 6A-D and FIG. 7 are provided to illustrate in more detail the timing of imprint process stages in relation to dispensing fluid mediums and actuating the vacuum port feature for removal the dispensed fluid medium comprising the blocked drops 8.

First, at timing t=1, the dispenser 50 is turned ON to dispense fluid medium on the field area 16 of the substrate. In this initial dispensing stage, the vacuum feature is turned OFF. Next, at timing t=2, the field area 16 of the substrate is moved along the y-axis to a next imprint location while the dispenser 50 is turned OFF. Also, in this moving stage, the vacuum feature is turned ON to evacuate the blocked drops 8. Then, at timing t=3, imprinting and separation are performed (not shown) while the dispenser 50 remains turned OFF. Also, in this imprinting and separation stage, the vacuum feature remains turned ON to evacuate the blocked drops 8. Finally, at timing t=4, the field area of substrate 16 is moved to the next appropriate position under the dispenser 50 while the dispenser 50 remains turned OFF. Moreover, in this stage, the vacuum feature remains turned ON to continue evacuating the blocked drops 8. Accordingly, the aforementioned timing of the numerous process stages may be repeated as required.

Example Method of Manufacturing Fluid Dispenser Apparatus, Fluid Dispenser Shield Assembly, Imprint Apparatus and/or Article An example method of manufacturing a device (for example, a semiconductor device, magnetic storage medium, or liquid crystal display element) as an article will be explained. This manufacturing method includes a step of forming a pattern on a substrate (for example, a wafer, glass plate, or film substrate) using an imprint apparatus described in the above embodiment. This manufacturing method further includes a step of processing the substrate on which the pattern has been formed. The processing step can include a step of removing the residual film of the pattern. In addition, the method can include other known steps such as a step of etching the substrate using the pattern as a mask. The method of manufacturing an article according to this embodiment is advantageous over the related art in terms of at least one of the performance, quality, productivity, and production cost of articles.

Other Aspects, Features and Example Embodiments

It will thus be appreciated that those skilled in the art will be able to devise numerous systems, arrangements and methods which, although not explicitly shown or described herein, embody the principles of the invention and are thus within the spirit and scope of the present invention. In addition, to the extent that the prior art knowledge has not been explicitly incorporated by reference herein above, it is explicitly being incorporated herein in its entirety. All publications referenced herein above are incorporated herein by reference in their entireties.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

While the disclosure has been described with reference to example embodiments, it is to be understood that the present disclosure is not limited to the disclosed example embodiments. The scope of the following claims is to be accorded the broadest interpretation so as to encompass all such modifications and equivalent structures and functions.

What is claimed:

1. A fluid dispenser apparatus comprising:
   a fluid dispenser including a first plurality of nozzles and a second plurality of nozzles aligned in a longitudinal direction, wherein the first plurality of nozzles is between the second plurality of nozzles in the longitudinal direction;
   a dispenser shield including an aperture and blocking portions, the dispenser shield being positioned relative to the first and second plurality of nozzles such that the aperture is aligned in the longitudinal direction with the first plurality of nozzles and the blocking portions are aligned in the longitudinal direction with the second plurality of nozzles; and
   a tension mechanism configured to adjust tension of the dispenser shield to prevent the dispenser shield from sagging relative to the fluid dispenser,
   wherein the first and second plurality of nozzles are configured to dispense fluid towards a substrate, and
   wherein the dispenser shield is positioned such that fluid dispensed from the first plurality of nozzles passes through the aperture while fluid dispensed from the second plurality of nozzles is blocked by the blocking portions and captured by the dispenser shield.

2. The fluid dispenser apparatus according to claim 1, wherein the aperture is adjustably moveable along the longitudinal direction.

3. The fluid dispenser apparatus according to claim 1, wherein the aperture is expandable or contractible along the longitudinal direction.

4. The fluid dispenser apparatus according to claim 1, wherein the dispenser shield includes a channel for receiving the captured fluid from the dispenser shield.

5. The fluid dispenser apparatus according to claim 1, further comprising at least one vacuum port configured to remove the captured fluid from the dispenser shield.

6. The fluid dispenser apparatus according to claim 5, wherein the dispenser shield includes a channel for receiving the captured fluid from the dispenser shield.

7. The fluid dispenser apparatus according to claim 6, wherein the at least one vacuum port is connected to a tube that has a terminus end position within the channel for removing the captured fluid from the dispenser shield.

8. The fluid dispenser apparatus according to claim 1, further comprising a pair of aperture support brackets configured to attach the dispenser shield to the fluid dispenser,
   wherein the dispenser shield has opposing distal ends along the longitudinal direction, and
   wherein one of the pair of aperture support brackets is attached to a respective each one of the opposing distal ends of the dispenser shield.

9. A fluid dispenser shield assembly adapted to be installed onto a fluid dispenser including a first plurality of nozzles and a second plurality of nozzles aligned in a longitudinal direction, the first plurality of nozzles being between the second plurality of nozzles in the longitudinal direction, the fluid dispenser shield assembly comprising:
   a dispenser shield including an aperture and blocking portions, the dispenser shield being configured to be positioned relative to the first and second plurality of nozzles such that the aperture is aligned in the longitudinal direction with the first plurality of nozzles and the blocking portions are aligned in the longitudinal direction with the second plurality of nozzles; and
   a tension mechanism configured to adjust tension of the dispenser shield to prevent the dispenser shield from sagging relative to the fluid dispenser,
   wherein the first and second plurality of nozzles are configured to dispense fluid towards a substrate, and
   wherein the dispenser shield is positioned such that fluid dispensed from the first plurality of nozzles passes through the aperture while fluid dispensed from the second plurality of nozzles is blocked by the blocking portions and captured by the dispenser shield.

10. The fluid dispenser shield assembly according to claim 9, wherein the aperture is adjustably moveable along the longitudinal direction.

11. The fluid dispenser shield assembly according to claim 9, wherein the aperture is expandable or contractible along the longitudinal direction.

12. The fluid dispenser shield assembly according to claim 9, wherein the dispenser shield includes a channel for receiving the captured fluid from the dispenser shield.

13. The fluid dispenser shield assembly according to claim 9, further comprising at least one vacuum port configured to remove the captured fluid from the dispenser shield.

14. The fluid dispenser shield assembly according to claim 13, wherein the at least one vacuum port is connected to a tube that has a terminus end position within the channel for receiving the captured fluid from the dispenser shield.

15. The fluid dispenser shield assembly according to claim 9, further comprising a pair of aperture support brackets configured to attach the dispenser shield to the fluid dispenser assembly,
   wherein the dispenser shield has opposing distal ends along the longitudinal direction, and
   wherein one of the pair of aperture support brackets is attached to a respective each one of the opposing distal ends of the dispenser shield.

16. An imprint apparatus comprising:
   a fluid dispenser including a first plurality of nozzles and a second plurality of nozzles aligned in a longitudinal direction, wherein the first plurality of nozzles is between the second plurality of nozzles in the longitudinal direction;
   a dispenser shield including an aperture and blocking portions, the dispenser shield being positioned relative to the first and second plurality of nozzles such that the aperture is aligned in the longitudinal direction with the first plurality of nozzles and the blocking portions are aligned in the longitudinal direction with the second plurality of nozzles; and a tension mechanism configured to adjust tension of the dispenser shield to prevent the dispenser shield from sagging relative to the fluid dispenser, wherein the first and second plurality of nozzles are configured to dispense fluid towards a substrate, and wherein the dispenser shield is positioned such that fluid dispensed from the first plurality of nozzles passes through the aperture while fluid dispensed from the second plurality of nozzles is blocked by the blocking portions and captured by the dispenser shield.

17. A method of manufacturing an article, the method comprising:

forming a pattern on a substrate using an imprint apparatus; and processing the substrate, on which the pattern has been formed, to manufacture the article, wherein the imprint apparatus performs imprint processing of forming the pattern of an imprint material on the substrate using a mold, and includes:

a fluid dispenser including a first plurality of nozzles and a second plurality of nozzles aligned in a longitudinal direction, wherein the first plurality of nozzles is between the second plurality of nozzles in the longitudinal direction;

a dispenser shield including an aperture and blocking portions, the dispenser shield being positioned relative to the first and second plurality of nozzles such that the aperture is aligned in the longitudinal direction with the first plurality of nozzles and the blocking portions are aligned in the longitudinal direction with the second plurality of nozzles; and a tension mechanism configured to adjust tension of the dispenser shield to prevent the dispenser shield from sagging relative to the fluid dispenser, wherein the first and second plurality of nozzles are configured to dispense fluid towards a substrate, and wherein the dispenser shield is positioned such that fluid dispensed from the first plurality of nozzles passes through the aperture while fluid dispensed from the second plurality nozzles is blocked by the blocking portions and captured by the dispenser shield.

* * * * *